United States Patent
Li et al.

(10) Patent No.: US 6,744,794 B2
(45) Date of Patent: Jun. 1, 2004

(54) SYSTEM AND A METHOD FOR HANDLING LASER COMMUNICATION MULTIPLEXING IN CHAOTIC SECURE COMMUNICATIONS

(75) Inventors: Chung-Hsi Li, Ban Chiao (TW); Wen-Wei Lin, Taipei (TW)

(73) Assignee: Teh Fa Technology Co., Ltd., Jung-He (TW)

( * ) Notice: Subject to any disclaimer, the term of this patent is extended or adjusted under 35 U.S.C. 154(b) by 43 days.

(21) Appl. No.: 10/087,946

(22) Filed: Mar. 5, 2002

(65) Prior Publication Data

US 2003/0180053 A1 Sep. 25, 2003

(51) Int. Cl.$^7$ ................................ H01S 3/00
(52) U.S. Cl. .................... 372/38.02; 372/38.1
(58) Field of Search .............. 372/38.02, 38.1

(56) References Cited

U.S. PATENT DOCUMENTS 5,291,555 A * 3/1994 Cuomo et al. ............. 380/263
6,160,651 A * 12/2000 Chang et al. ............... 359/124

* cited by examiner

*Primary Examiner*—Paul Ip
*Assistant Examiner*—Leith A Al-Nazer
(74) *Attorney, Agent, or Firm*—Bacon & Thomas, PLLC

(57) ABSTRACT

A system and a method for handling laser-communication multiplexing in chaotic secure communications are disclosed. The messages to be multiplexed are encoded by chaotic laser signals of a transmitter system. The transmitted signals are then coupled to another chaotic system, the receiver system, so that the receiver and the transmitter are asymptotically synchronized. The decoding of the multiplexed messages encoded by chaotic behaviors is achieved by using a low-pass filter. This low-pass filter can effectively increase the fractal dimension of the chaotic system and enhance the periodicity of the transmitted time sequences, so that the multiplexed messages can be recovered.

4 Claims, 7 Drawing Sheets

Responsing

SYSTEM AND A METHOD FOR HANDLING LASER COMMUNICATION MULTIPLEXING IN CHAOTIC SECURE COMMUNICATIONS

BACKGROUND OF THE INVENTION

1. Field of the Invention

The present invention relates to a system and method for handling laser-communication multiplexing in chaotic secure communications, and more particularly, for decoding multiplex chaotic laser signals by utilizing a low-pass filter to increase the fractal dimension of the chaotic system, so that decoding of the multiplex messages encoded by chaotic behaviors can be achieved. The disclosure of the present invention can be applied to many kinds of secure communication systems.

2. Discussion of the Prior Art

The technique of multiplex transmission has been well established in the field of conventional laser communications. However, there is still no effective scheme for applying such laser multiplexing to chaotic secure communication systems. Moreover, although it is known that chaotic systems can be applied to secure communications, the conventional techniques of simplex-coupled synchronization can only work well in simplex transmission, and therefore difficulties arise in handling multiplex transmission. The main reason can be attributed to the nonlinear interaction among the multiplex laser signals, resulting in a superimposed, interfering and complex chaotic system. To resolve these two problems, a low-pass filter is utilized to increase the fractal dimension of the multiplex chaotic signals, so that the periodicity of these chaotic signals will be enhanced. This technique can be used to rebuild the multiplexed messages encoded by chaotic behaviors in laser communications.

SUMMARY OF THE INVENTION

It is an object of the present invention to provide a method for handling laser-communication multiplexing in chaotic secure communications. By using a low-pass filter, a chaotic time sequence of lower fractal dimension can be effectively increased to a chaotic time sequence of higher fractal dimensional, so that the periodicity of the multiplex signals will be enhanced and hence the decoding of messages from the chaotic laser signals become possible.

It is another object of the present invention to provide a method for handling laser-communication multiplexing in chaotic secure communications, wherein the scheme of chaotic secure communications utilizes the behavior of extremely sensitive dependence on initial conditions and the feature of randomness of the chaotic laser light.

It is another object of the present invention to provide a method for handling laser-communication multiplexing in chaotic secure communications, wherein the scheme of chaotic secure communications is achieved by adjusting the coupling parameters of the receiver system, so that the chaotic system of the receiver end is simplex coupled to the transmitter end, and thus prohibiting the transmitted messages to be rebuilt by any unauthorized receptor.

DETAILED DESCRIPTION

As has been proven by computer experiments and numerical simulations, the system and the method of the present invention is an effective scheme for handling laser-communication multiplexing in chaotic secure communications. The system and the method for encoding and decoding the messages to be multiplexed utilizes the following steps:

Step 1. Driving self-pulsating laser diodes to generate chaotic laser signals.

Figure 1:
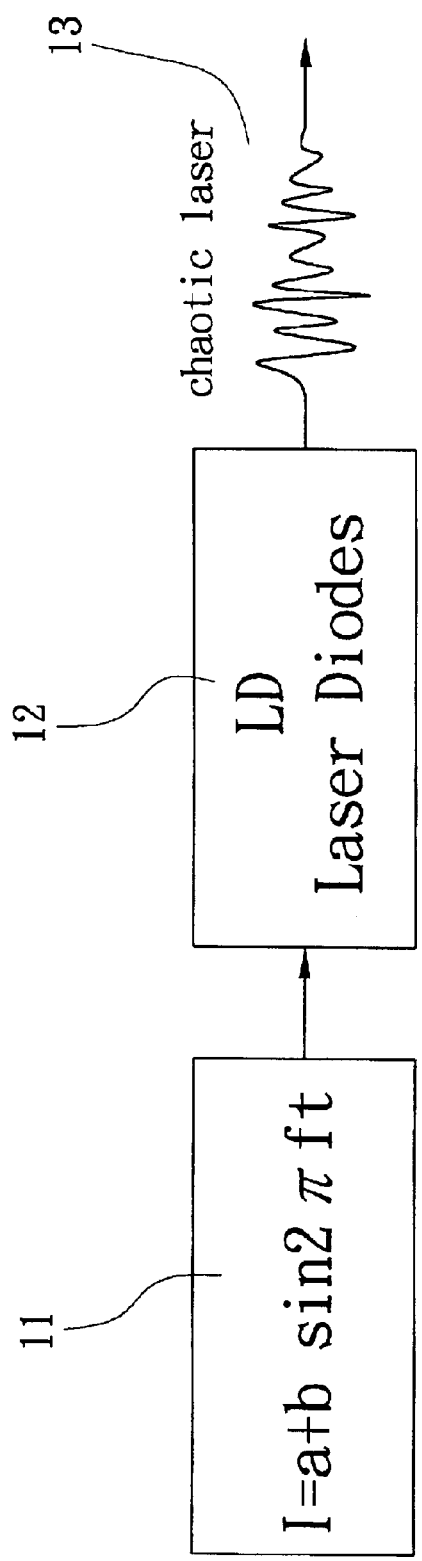
FIG. 1 is a block diagram for describing a chaotic sequence generated from a self-pulsating laser diode by adjusting the amplitude and frequency of the externally applied driven ac current.

As shown in FIG. 1, the self-pulsating laser diode 12 is driven by an externally applied ac current, $I=a+b \sin(2\pi ft)$, where a, b and f are the offset current, the amplitude and the frequency of the ac current respectively. By adjusting the amplitude and the frequency of the input ac current, the self-pulsating laser diode will generate a chaotic laser light 13. The reason for this chaotic behavior is the conflict between the frequency of the applied ac current and the natural frequency of the self-pulsating laser diode 12, leading the system to a quasi-period-two behavior. According to the theory of chaos, i.e., quasi-period-two routes chaos, the self-pulsating laser diode 12 will generate chaotic laser signals 13 when the amplitude and frequency of the applied ac current are adjusted appropriately. The chaotic behavior of the laser output can be further confirmed by Poincaré section, Lyapunov exponent and bifurcation diagram. This chaotic behavior is the most important precondition for encoding the message. Since a chaotic system depends sensitively on initial conditions and exhibits a random behavior, it is very difficult to decode the hidden message in the chaotic carrier.

Step 2. Synchronization of the chaotic laser signals

Figure 2:
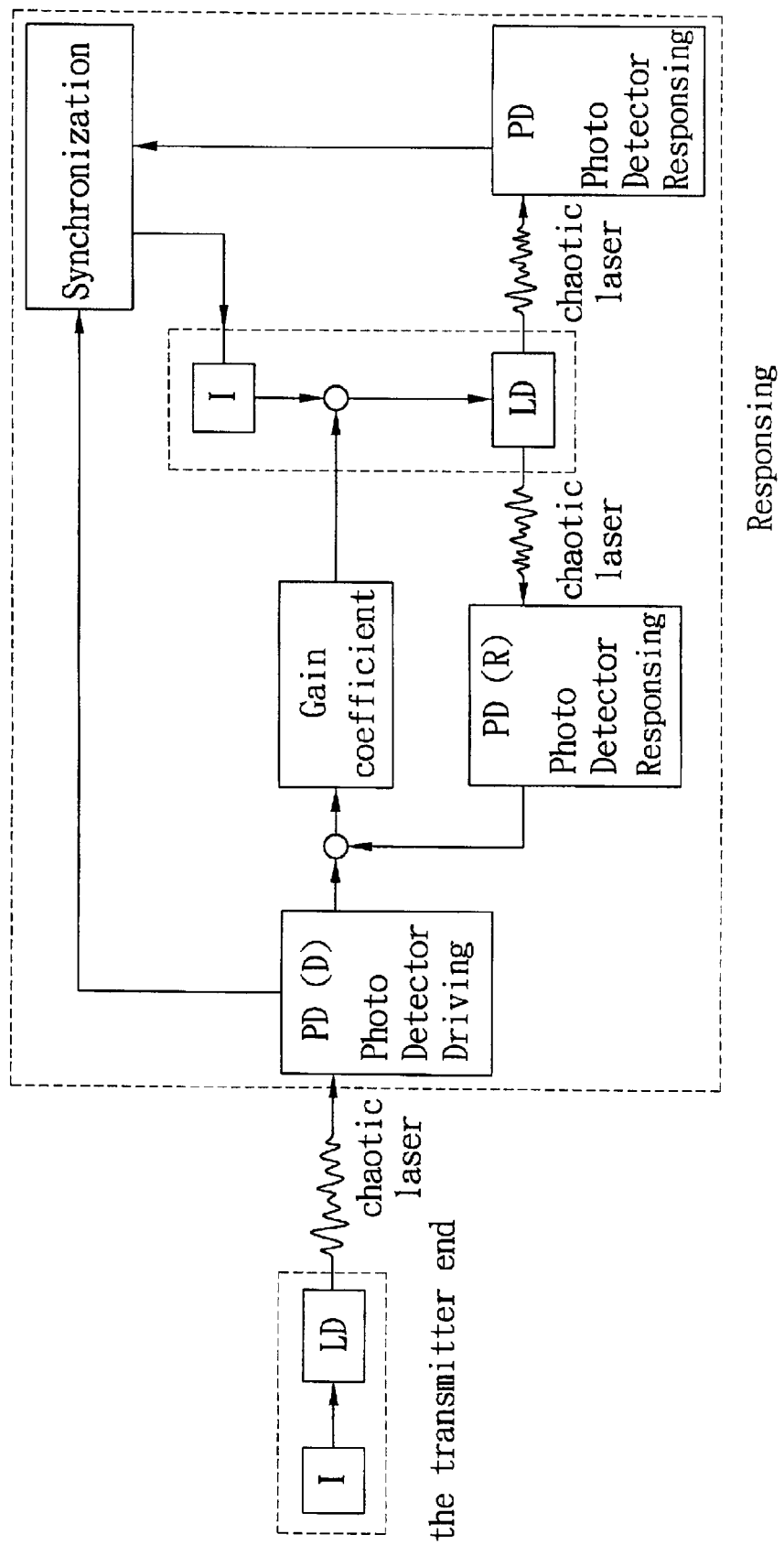
FIG. 2 is a block diagram for illustrating the procedure of synchronizing the chaotic laser signal of the receiver with that of the transmitter.

Synchronization is the most important technique in communication applications. As shown in FIG. 2, the chaotic laser signals, which are detected by photo detector PD(D), and generated by the transmitter according to the method described in step 1, can be simplex-coupled to the response chaotic laser signals PD(R) of the receiver end by using the transmitter signal to drive the receiver signal and by adjusting the gain of the receiver signal so that the signal-encoded and re-created chaotic signals between the transmitter and receiver ends can be compared. According to our computer experiments and numerical simulations, for a suitable gain coefficient, the chaotic sequences of the response and the drive systems will be synchronized. This phenomenon is also the basic principle for utilizing these chaotic behaviors in secure communications. This synchronization can be further confirmed by using the conditional Lyapunov exponent. The signature of simplex-coupled behavior exhibited between two chaotic systems will prevent the transmitted messages from being rebuilt by an unauthorized receptor.

Step 3. Using the simplex asymptotical synchronization principle.

Figure 4A:
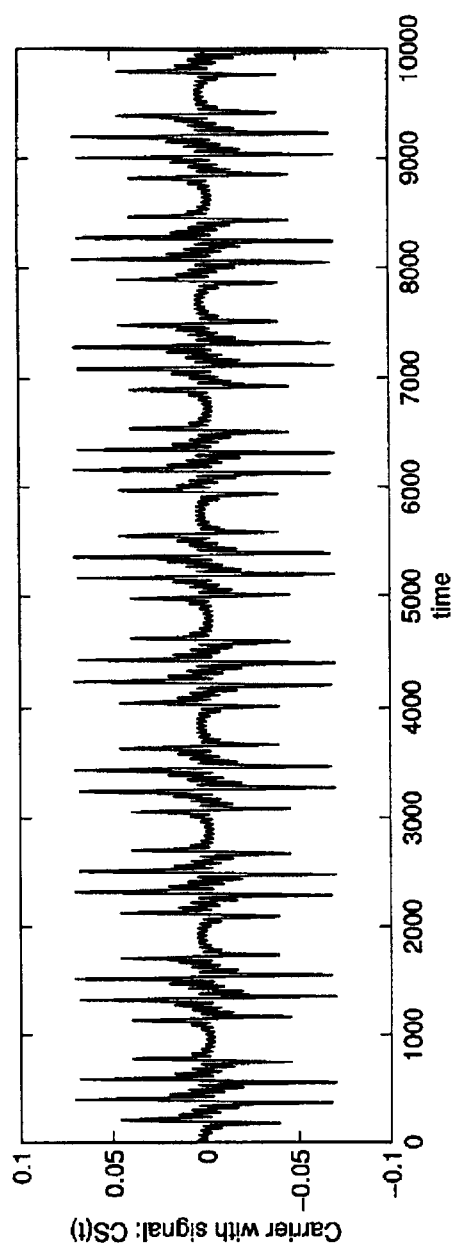
FIGS. 4($a$) and ($b$) are the time sequence, Signal(t), of the multiplexed signals and the frequency spectrum of the multiplexed signal obtained by taking FFT to the Signal(t)
Figure 4B:
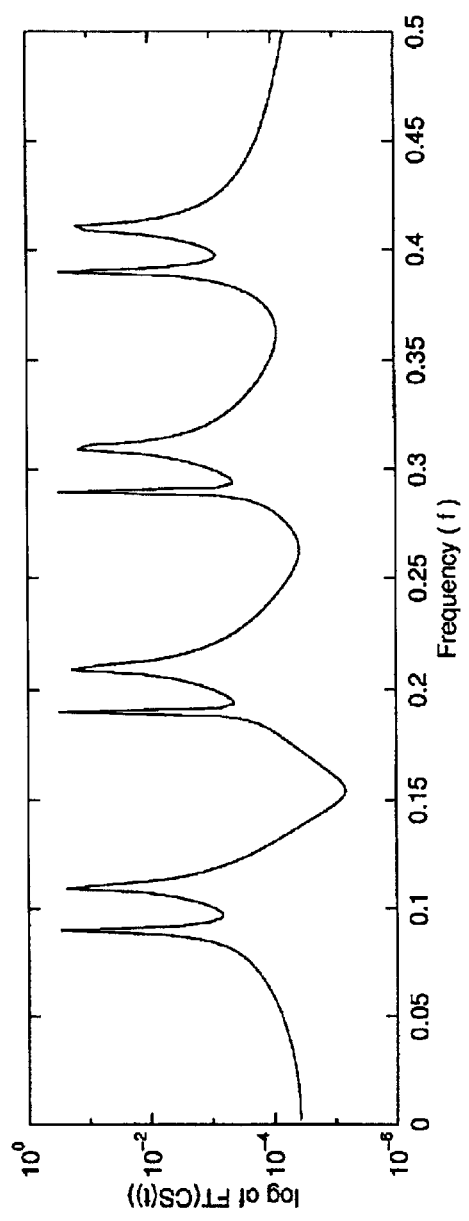
Figure 5A:
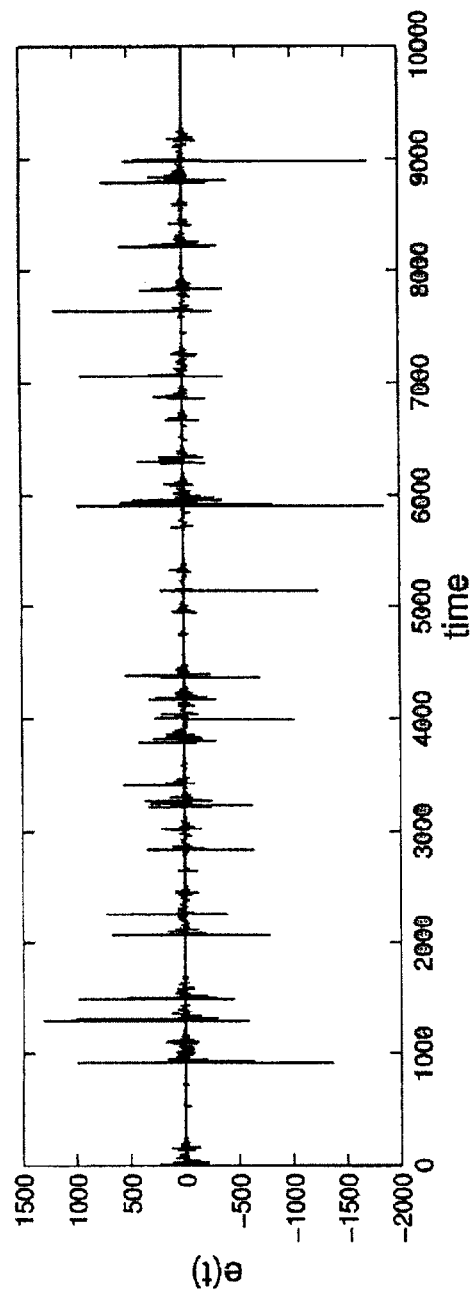
FIGS. 5($a$) and ($b$) illustrate the output, e(t), of the receiver system after chaotic synchronization and the corresponding frequency spectrum after taking FFT to the e(t)
Figure 5B:
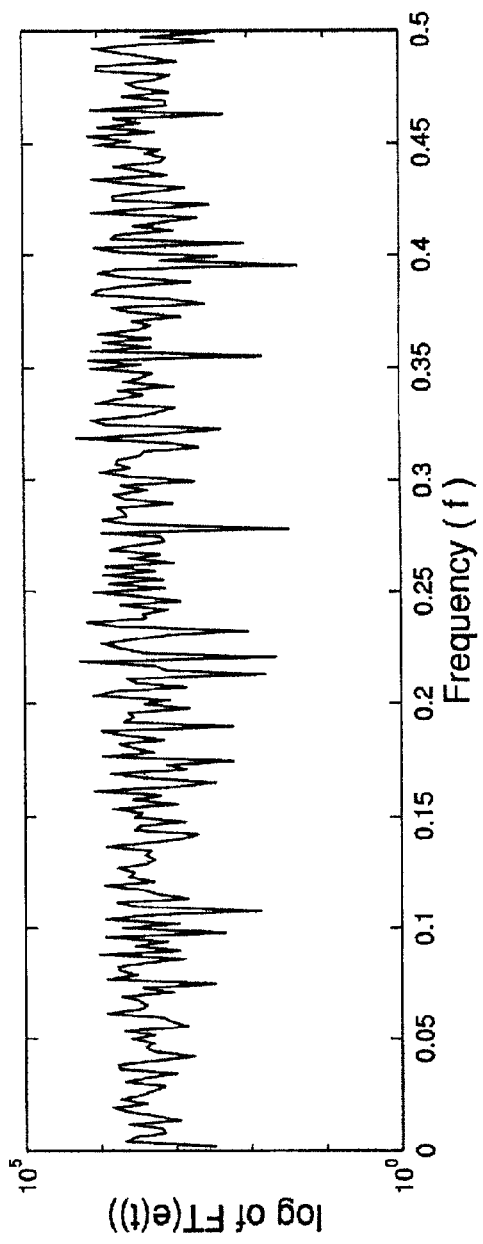

Asymptotical synchronization is the most important technique for recovering the messages encoded by chaotic carrier. By using the simplex asymptotical synchronization principle, when the chaotic laser light of the transmitter containing messages is delivered to the receiver end, the receiver can reproduce an asymptotical synchronized chaotic laser light. The carried messages can then be rebuilt by applying a Fast-Fourier transformation (FFT) to the difference between the output signals of the transmitter and the receiver. This technique is well established for decoding a simplex transmission message. However, for the case of multiplex transmission, due to the complex phenomenon induced by the nonlinear interactions between different multiplex channels, it is difficult to rebuild the transmitted messages by simply applying an FFT to the synchronized chaotic systems. This can be seen in FIGS. 4(a), 4(b), 5(a) and 5(b). The messages to be multiplexed are shown in FIG. 4(a) and 4(b), which are the time sequences, Signal(t), of the messages to be multiplexed and the corresponding frequency spectrum resulting from application of the FFT to the Signal(t), respectively. The difference, e(t), between the output signals of the transmitter and the receiver after synchronisation is displayed in FIG. 5(a). However, as shown in FIG. 5(b), the transmitted messages cannot be rebuilt by simply applying the FFT to the difference e(t). Therefore, the decoding of multiplexed messages carried by chaotic signals should further utilized the technique described in the following step.

Step 4. Use of a low-pass filter to transfer chaotic time sequence to higher fractal dimension.

Figure 3:
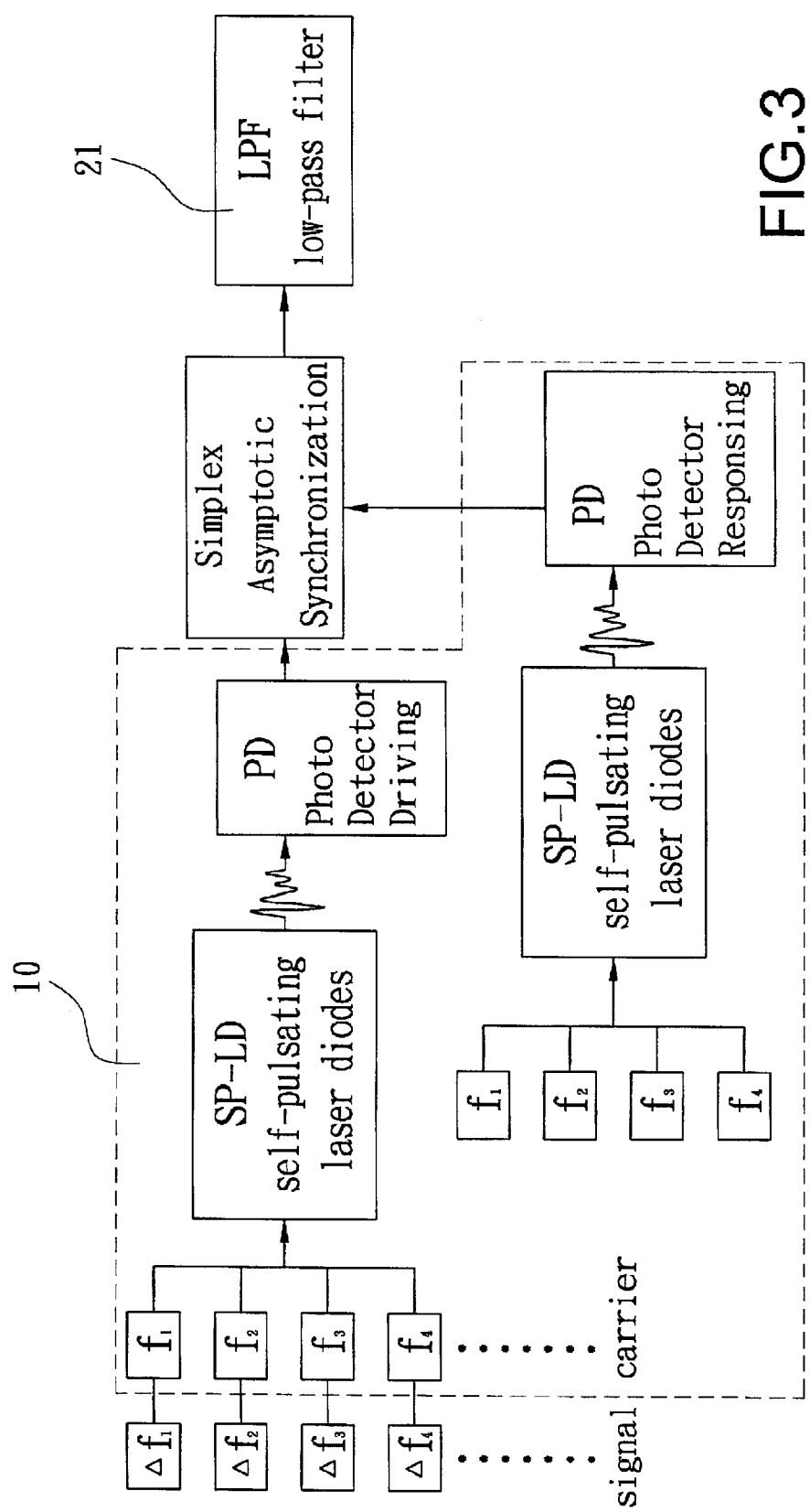
FIG. 3 is a block diagram for illustrating the use of low-pass filter to decode multiplexed messages encoded by chaotic signals.
Figure 6A:
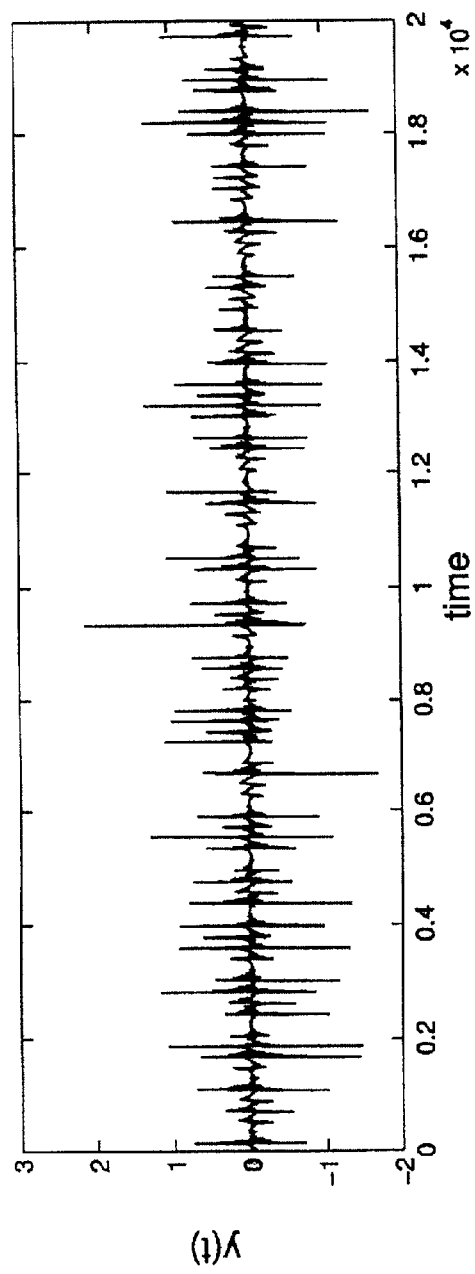
FIGS. 6($a$) and ($b$) show the output, y(t), from the low-pass filter of the present invention and the corresponding frequency spectrum after taking FFT to the y(t)
Figure 6B:
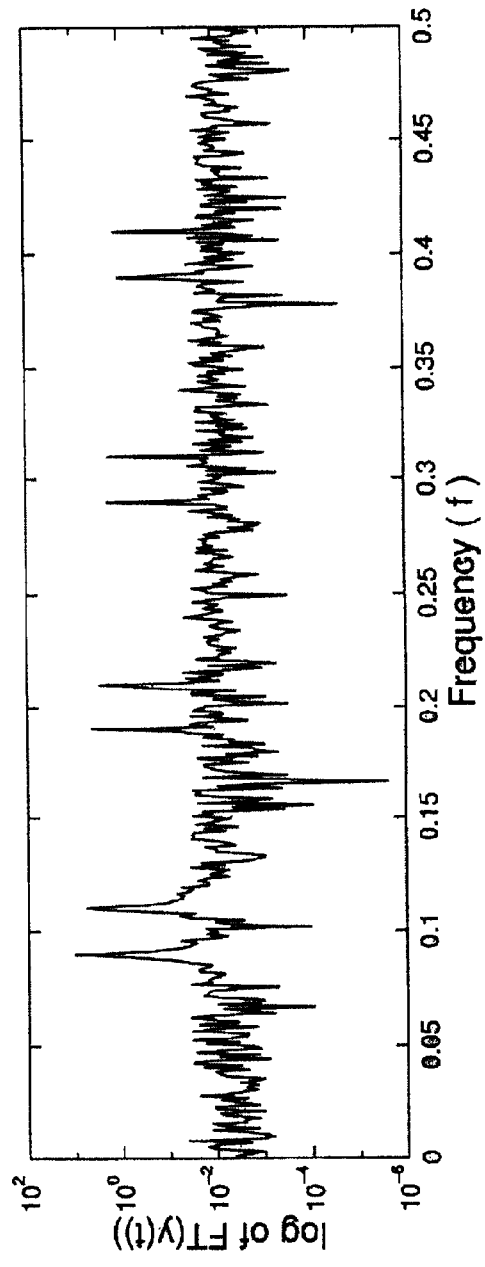
Figure 7:
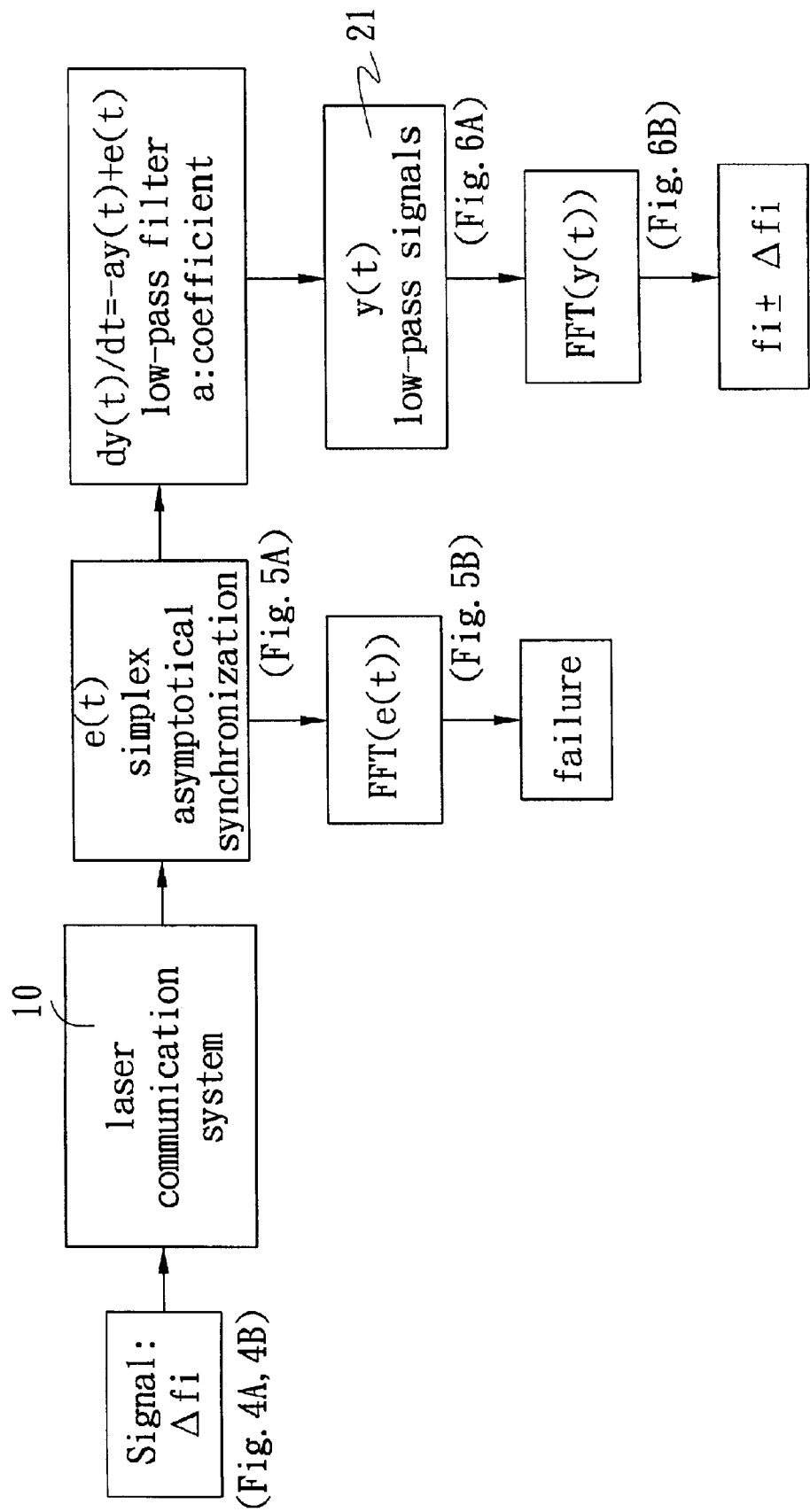
FIG. 7 is a flowchart for illustrating the scheme of the chaotic secure communication and a comparison between the procedures of the conventional system without using the low-pass filter of the present invention and the system of the present invention with the use of low-pass filter.

This procedure is the most important technique for recovering the multiplexed messages encoded by chaotic signals, which is also the major part of the present invention. As shown in FIG. 3, due to the nonlinear interactions among different multiplex channels, the multiplex channels, the multiplex signals will interfere and superimpose with each other. Thus, the multiplexed messages cannot be fully recovered, if the conventional method as described in step 3 was used to decode them. To resolve this problem, this invention introduces a low-pass filter 21 to process the chaotic signals output by the laser communication system 10 after synchronization. As illustrated in FIG. 7, first, the difference, e(t), between the output of the transmitter and the receiver is sent into the low-pass filter. The low-pass filter can be described by the following differential equation, $$\frac{dy(t)}{dt} = -\alpha y(t) + e(t)$$

where α is the parameter of the low-pass filter and y(t) is the signal after low-pass-filtering. According to out numerical simulations, if the parameter α is in the range of 0.13–0.97, the original chaotic time sequence of lower fractal dimension will be transferred to a chaotic time sequence of higher fractal dimension. Owing to the higher fractal dimension, the periodicity of these multiplex messages will emerge and hence the decoding of these multiplexed messages can be achieved. The effects of the low-pass filter can be seen in FIGS. 6(a) and (b). By comparing FIG. 6(b) with FIG. 4(b), it is clear that the multiplexed messages have been rebuilt by applying the FFT to the signals after being sent through the low-pass filter of the present invention.

What is claimed is:

1. A system for handling laser-communication multiplexing in chaotic secure communications, comprising
a transmitter containing a self-pulsating laser diode, wherein the self-pulsating laser diode is driven by an externally applied ac current containing messages to be multiplexed;
a receiver containing a self-pulsating laser diode, wherein the self-pulsating laser diode of the receiver is driven by signals output by the transmitter, wherein said receiver includes:
a synchronization device for simplex-coupling the signals output by the transmitter to response signals of the receiver by adjusting an amplitude of the self-pulsating laser diode according to a predetermined coupling coefficient shared by the transmitter and receiver and comparing output signals from the self-pulsating laser diode of the receiver with the signals output by the transmitter to obtain a difference signal including synchronized chaotic time sequences; and
a low-pass filter, to which the difference signal is applied, said low-pass filter transforming chaotic time sequences of lower fractal dimension into chaotic time sequences of higher fractal dimension to cause a periodicity of the multiplexed messages to emerge by adjusting an appropriate parameter of the low-pass filter, thereby decoding the multiplexed message encoded by the chaotic laser light of the transmitter end.

2. The system for handling laser-communication multiplexing in chaotic secure communications as described in claim 1, wherein the parameter of the said low-pass filter is in the range 0.13–0.97.

3. A method for handling laser-communication multiplexing in chaotic secure communications, which comprises the following procedures,
a. applying a set of messages to be multiplexed and a corresponding set of ac currents to a laser diode of a transmitter end;
b. driving the laser diode of the transmitter end by the ac current set and adjusting the amplitude and frequency of the said ac current set to produce chaotic laser signals;
c. driving a laser diode of a receiver end by the chaotic signals generated from the transmitter end to obtain receiver end chaotic signals, simplex-coupling the receiver end chaotic signals to the transmitter end chaotic signals by supplying a predetermined coupling coefficient to the laser diode of the receiver end, thereby causing the receiver end chaotic signals to match the chaotic signals generated from the transmitter end, and comparing the chaotic signals to obtain a difference signal containing chaotic time sequences;
d. sending the difference signal to a low-pass filter; and
e. adjusting a parameter of the low-pass filter to cause chaotic time sequences of lower fractal dimension to be transferred to chaotic time sequences of higher fractal dimension and the periodicity of the multiplexed messages to emerge, thereby decoding the multiplexed messages encoded by the chaotic laser light of the transmitter end.

4. The method for handling laser-communication multiplexing in chaotic secure communications as described in claim 3, wherein the parameter of the said low-pass filter is in the range 0.13–0.97.

* * * * *